United States Patent [19]
Chakravarti et al.

[11] Patent Number: 6,077,786
[45] Date of Patent: Jun. 20, 2000

[54] METHODS AND APPARATUS FOR FILLING HIGH ASPECT RATIO STRUCTURES WITH SILICATE GLASS

[75] Inventors: Ashima B. Chakravarti, Hopewell Junction; Richard A. Conti, Mount Kisco; Donna R. Cote, Poughquag; Frank V. Liucci, Wappinger Falls, all of N.Y.; Son V. Nguyen, San Jose, Calif.

[73] Assignee: International Business Machines Corporation, Armonk, N.Y.

[21] Appl. No.: 08/854,011

[22] Filed: May 8, 1997

[51] Int. Cl.[7] .................................................. H01L 21/311
[52] U.S. Cl. ........................ 438/695; 216/37; 427/255.37
[58] Field of Search ........................... 216/37; 427/255.3; 438/695

[56] References Cited

U.S. PATENT DOCUMENTS

| | | |
|---|---|---|
| 4,894,352 | 1/1990 | Lane et al. . |
| 5,215,787 | 6/1993 | Homma . |
| 5,275,977 | 1/1994 | Otsubo et al. . |
| 5,362,526 | 11/1994 | Wang et al. ............................. 427/573 |
| 5,453,395 | 9/1995 | Lur . |
| 5,563,105 | 10/1996 | Dobuzinski et al. . |
| 5,578,518 | 11/1996 | Koike et al. . |
| 5,750,211 | 5/1998 | Weise et al. ............................. 427/579 |

FOREIGN PATENT DOCUMENTS

| | | |
|---|---|---|
| 0 562 625 A2 | 3/1993 | European Pat. Off. . |
| 57-12533 | 1/1982 | Japan . |
| 59-181640 | 10/1984 | Japan . |
| 61-29167 | 2/1986 | Japan . |

OTHER PUBLICATIONS

Arthur Sherman, Chemical Vapor Deposition for Microelectronics, 1987, pp. 40, 41, 56.

D. R. Cote, S. V. Nguyen, W. J. Cote, S. L. Pennington, A. K. Stamper, D. V. Podlesnik, Low–Temperature Chemical Vapor Deposition Processes and Dielectrics for Microelectronic Circuit Manufacturing at IBM, IBM Journal of Research and Development, vol. 39, No. 4, Jul. 1995, pp. 437–464.

*Primary Examiner*—Richard Bueker
*Assistant Examiner*—Alva C. Powell
*Attorney, Agent, or Firm*—Whitham, Curtis & Whitham; Jay H. Anderson, Esq.

[57] ABSTRACT

Filling of narrow and/or high aspect ratio gaps and trenches with silicate glass is accomplished at reduced temperatures and without reflow by etching the glass concurrently with thermal chemical vapor deposition of the glass such that the deposition rate will exceed the etching rate by a relatively small net deposition rate near the surface with the excess deposition rate increasing over the depth of the trench or gap. The as-deposited glass film is made dense and stable by carrying out the concurrent etch and deposition process at an elevated temperature but which is within the maximum temperature and heat budget which can be tolerated by structures formed by previously performed processes. Fluorine can be incorporated in the silicate glass film as a dopant in sufficient concentration to reduce dielectric constant of the film. Phosphorus and/or boron can be incorporated into the film, as well, and may enhance void-free filling of trenches and gaps.

12 Claims, 1 Drawing Sheet

METHODS AND APPARATUS FOR FILLING HIGH ASPECT RATIO STRUCTURES WITH SILICATE GLASS

BACKGROUND OF THE INVENTION

1. Field of the Invention

The present invention generally relates to the manufacture of semiconductor devices and, more particularly, insulating and passivation layers thereof.

2. Description of the Prior Art

Advances in processes for manufacture of semiconductor devices now permit millions of circuit elements such as capacitors for dynamic memories and transistors for logic arrays to be formed on a single chip. Many of these advances have been made possible through improvements in process control since the conditions under which desired structures are formed may adversely affect previously formed structures.

For example, impurities may be located with substantial precision within a volume of semiconductor material by control of implantation processes and are generally diffused slightly during subsequent annealing at elevated temperature for a short period of time. Compensation for this diffusion can generally be made by the initial location of the implant so that the diffusion during carefully controlled heat treatment achieves the desired location of the impurities. The heat treatment also serves to repair damage to the crystal lattice structure caused by the implantation process by annealing.

However, further heat treatment subsequent to annealing may cause further diffusion which is not desired. Any such further diffusion becomes particularly critical as the sizes of structures forming electronic elements is reduced to obtain higher integration densities and high performance of transistors. Oxide growth may also occur at insulator interfaces through similar mechanisms of material diffusion. Accordingly, an aspect of integrated circuit design is referred to as a heat budget which must not be exceeded if fabrication of the integrated circuit device is to be successfully accomplished. Maximum temperatures are also imposed by some structures which cannot be exceeded after the structures are formed.

Integrated circuits including a large plurality of individual circuit elements also require those elements to be interconnected as well as connected to other structures (e.g. connection pads) for supplying power and input signals to the chip and extracting output signals from it. Such connections are generally made to overlie the circuit elements on the chip and therefore must be insulated therefrom except where connections are to be made.

The integrity and reliability of such connections may be compromised if the topology which the connections must traverse is severe. For these circuit elements, a silicate glass ($SiO_2$) is normally used as an insulator between metal line interconnections or in shallow trench isolation structures. In addition to conventional silicate glass, phosphorus is added as a dopant to provide alkali (Na, K, Li) gettering capability in the pre-metal dielectric (PMD) layer. Dopant concentrations of 2%–4% by weight of phosphorus are required to getter alkali elements. In the resulting phosphosilicate glass (PSG) layer, the addition of dopant also softens the silicate glass and provides an enhanced reflow characteristic under high temperature annealing conditions.

Accordingly, a common structure in the fabrication of integrated circuits is a so-called passivation layer, which is generally formed of a phosphosilicate glass film after electronic element structures are completed. To reduce severity of topology of the surface, it is necessary to fill surface discontinuities such as trenches or gaps between portions of a patterned layer without creating voids in the insulating layer which may cause metal shorts in metal layers deposited after the contact opening process.

Since trenches and gaps under current design rules may have a relatively high aspect ratio (e.g. 4:1 or greater ratio of depth to width) and be quite narrow (e.g. 0.2–0.1 µm or less), filling them is difficult. Failure to adequately fill such trenches and gaps is very likely to cause a major adverse impact on manufacturing yield either by creation of voids or failure to reduce severity of surface topology which compromises metal conductors. Voids are generally due to more rapid deposition at the top of a trench or gap than at the bottom, closing or restricting delivery of material to lower portions of the trench before it can be filled.

The insulator material must also be as dense as possible as deposited to provide a stable film that does not absorb atmospheric moisture. High film density thus avoids a post-deposition densification annealing step in forming the layer. High film density may also develop a high dielectric constant. However, as device spacings and film thicknesses are reduced, a high dielectric constant corresponding to suitable film density for good film stability may also increase capacitive coupling between conductors and becomes a source of noise susceptibility. Therefore, as will be discussed below, control of dielectric constant is becoming of increased importance in modern integrated circuit design.

To improve gap filling of fill material, silicate and phosphosilicate glass films are often deposited with boron doping (using a source such as triethylborate) to further reduce the viscosity of the glass so that these films can possibly flow (depending on temperature) both during deposition and/or during post-deposition annealing or thermal cycling. For shallow trench isolation (STI) applications, however, such doping is inappropriate due to the potential out-diffusion of boron to nearby device junctions. Where boron doping can be used, however, with moderate (4%–5% by weight) levels of boron doping, these films reflow after a thirty minute anneal at temperatures above 800°–850° C. and narrow gaps of aspect ratio in the range of 3:1–4:1 can be filled without voids. However, attempts to use a boron doping level in excess of 5% in combination with a 4%–5% phosphorus concentration are not successful due to instability of such highly doped films and defects that result therefrom.

Borophosphosilicate glass (BPSG) films may be deposited using tetraethylorthosilicate (TEOS), oxygen or ozone, a phosphorus source such as PH3, triethylphosphate (TEPO), triethylphosphite or trimethylphosphite and a boron source such as $B_2H_6$ or triethylborate. Temperatures of either 350°–450° C. or 800°–850° C. have been used for the deposition. Although the higher temperature range provides some reflow during deposition, subsequent annealing at 800°–850° C. is still required to provide void-free gap fill at aspect ratios of 3:1–4:1.

However, the temperature and duration of this anneal/reflow process allows only a small process window or tolerance within the heat budget for some types of integrated circuits such as some dynamic random access memories (DRAMs) and is wholly incompatible with some CMOS devices and logic arrays which may be limited to temperatures below 650° C. Additionally, for some recent logic array designs and CMOS devices in particular, boron has been observed to be an unacceptable contaminant at the pre-metal dielectric (PMD) level due to its effect on gate oxide threshold voltage.

Some variations in materials and thermal processing have been attempted to reduce the thermal cycle for producing a silicon dioxide or glass insulating layer but have only resulted in slight increase of the process window, at most. For example, published European Patent application 0562625 A2 by Imai teaches deposition of a fluorine doped borophosphosilicate glass (BPSG) film by sub-atmospheric pressure CVD at 350°–450° C. using fluorotriethoxysilane (F-TEOS) which requires a subsequent 850° C. reflow/anneal for 30 minutes rather than at 900° C. to achieve a desired reflow surface angle for adequate planarization. Such temperatures clearly remain unsuitable for developing pre-metal passivation layers for CMOS logic arrays as noted above and, for other types of devices, the slight increase in the process window generally does not justify the increase in material cost and process complexity by significant improvement in manufacturing yield.

Multi-step plasma deposition/etch processes have also been developed to fill sub-half micron gaps up to aspect ratios of 1.5:1. In addition to the limited range of aspect ratio, these processes suffer from low throughput and foreign material contamination and risk of causing damage to underlying gate oxide due to plasma charging.

Similarly, reduction of the anneal temperature to 650° C. or less in accordance with the maximum temperatures for further processing of circuits including some types of CMOS devices has limited the aspect ratio at which void-free trench or gap filling can be achieved to about 1.5:1 regardless of dopant content. In general, the need to fill higher aspect ratio structures becomes more critical to meet the application of merged logic and DRAM on a single chip. In such an application, the minimum aspect ratio is at least 2:1. Accordingly, it is seen that known techniques and materials suitable for depositing an insulating layer over some CMOS logic devices are not suitable for dynamic memories and vice-versa although it is desirable to provide both such structures on a single chip. Additionally, modern and advanced CMOS integrated circuit designs include some narrow, high aspect ratio features which cannot be adequately filled by known processes.

Further, while addition of fluorine into BPSG may be effective to reduce viscosity somewhat and may also be desirable to reduce dielectric constant (e.g. to control parasitic capacitances, as alluded to above), little fluorine will be incorporated if the temperature during deposition is too high (above 750° C. Thus the amount of incorporated fluorine will be small. For example, deposition at 750° C. or higher limits fluorine content to 0.1% or less. Therefore for many sources of fluorine such as fluoroethoxysilane (F-TEOS), deposition must be done at low temperatures which prevents high density from being developed in the as-deposited film and the low temperature deposition must be followed by a high temperature anneal/reflow process to achieve gap filling and increase density. Again, temperatures below 650° C. do not provide adequate gap filling of narrow or high aspect ratio gaps or trenches while higher temperatures are unsuitable for modern CMOS devices.

Many different methods of material deposition generally suitable for depositing silicon dioxide are known but fall short of providing a solution to high-aspect ratio gap-filling within necessary heat budgets and maximum temperatures. For example, in addition to the methods discussed above, plasma enhanced chemical vapor deposition (PECVD) has been extensively investigated for formation of passivation films. Gap-filling capability of a single step PECVD process (e.g. without reflow) is limited to about 1.5:1. Further, use of a plasma can cause charging of structures by irregularities of the plasma which can damage electronic structures such as gates of field effect transistors.

PSG and BPSG films may be deposited in either thermal CVD (THCVD) or plasma enhanced CVD (PECVD) reactors. However, while either a THCVD or PECVD PSG or BPSG may be used to fill low aspect ratio (e.g. less than 1:1) features without voids, at higher aspect ratios the gap filling capabilities of PECVD and THCVD processes diverge dramatically due to fundamental differences in the natures of these processes.

In PECVD, reactants are ionized and dissociated in the gas phase by collisions with energetic electrons. The gas mixture presented to the wafer surface has many more species than in the case of THCVD due to the vigorous decomposition of the initial gas by high energy electron bombardment. As a result of the highly energetic gas phase species, species collide with the surface with near unit probability of sticking and reacting. Thus step coverage in PECVD is usually poor and closure is usually observed at the tops of gaps requiring filling while voids are left lower in the gaps.

In contrast, in THCVD, less energetic species have a lower probability of being deposited at the location of first collision with a surface and either lower or higher conformality than PECVD may result, depending on the species to be deposited and the deposition conditions. Additionally, less energetic gas phase reactions that may result in desirable intermediates crucial in achieving a particular result such as void-free gap fill may be produced which are not available from PECVD processes.

Furthermore, while THCVD may be practiced from mTorr pressures to atmospheric pressures (760 Torr) and above, PECVD is usually limited to a regime below 20 Torr due to the difficulty in maintaining a plasma at greater pressures. In addition, while similar reactant species may be used in both PECVD and THCVD systems, as a result of differences noted above, thin films deposited by PECVD have different stoichiometries, stress and stability. Therefore, results achievable with PECVD may not be achieved with THCVD and vice-versa.

Liquid phase deposition (LPD) such as depositing silicon dioxide or fluorinated silicon dioxide from a saturated solution of hydrofluorosilicic acid also develops a low density film. While this process can be conducted at even lower temperatures than PECVD, annealing is required to improve density of deposition for film stability. However, void-free gap filling of the as deposited film is limited to aspect ratios of about 1:1.

Multi-step deposition and etch back processes have been attempted using phosphorus doped TEOS and ozone SACVD at 600 Torr for developing interlevel dielectric fill at sub-quarter micron regimes. All of these multi-step deposition and etch back processes use reactive ion etching which subjects the substrate to potential device damage due to electrical charging. This damage is detrimental to advanced logic and DRAM devices where gate oxide thicknesses may be as low as 50 Angstroms or less. Furthermore, even with such multi-step processes, small voids are not reliably prevented.

Accordingly, no known process provides adequate gap fill of features having a width of less than 0.2 microns with an aspect ratio greater than about 3:1 using a processing temperature below 650° C., maintaining the potential benefits of THCVD, or provides a dense and stable film, as deposited, which may be undoped or doped as desired with phosphorus, fluorine or a combination thereof or which provides such gap filling without boron doping while being compatible with boron doping in appropriate circumstances of semiconductor device design to further extend gap filling capabilities.

SUMMARY OF THE INVENTION

It is therefore an object of the present invention to provide a method and apparatus for depositing a premetal or passivation insulating layer or shallow trench isolation at a temperature below 650° C. which provides void-free trench or gap filling at aspect ratios of 3:1 or greater.

It is another object of the invention to provide a boron-free method and apparatus for depositing a pre-metal or passivation insulating layer at a temperature below 650° C. which provides void-free trench or gap filling.

It is a further object of the invention to provide a common process for depositing a trench or gap filling silicon dioxide film which is compatible with both CMOS logic and dynamic random access memory devices.

In order to accomplish these and other objects of the invention, a method of forming a silicate glass film is provided comprising the steps of heating a deposition surface to a temperature in the range of 500°–650° C., and concurrently depositing and etching a silicate glass including regulation of flow of reactant precursor materials and etchant materials such that deposition rate exceeds an etching rate.

In accordance with another aspect of the invention, apparatus for depositing a glass film is provided including a thermal chemical vapor deposition reactor, a source of material to be deposited, a source of etchant, and an arrangement for controlling flow rate from said source of material to be deposited and said source of etchant such that a rate of deposition of glass exceeds a rate at which said glass is etched.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
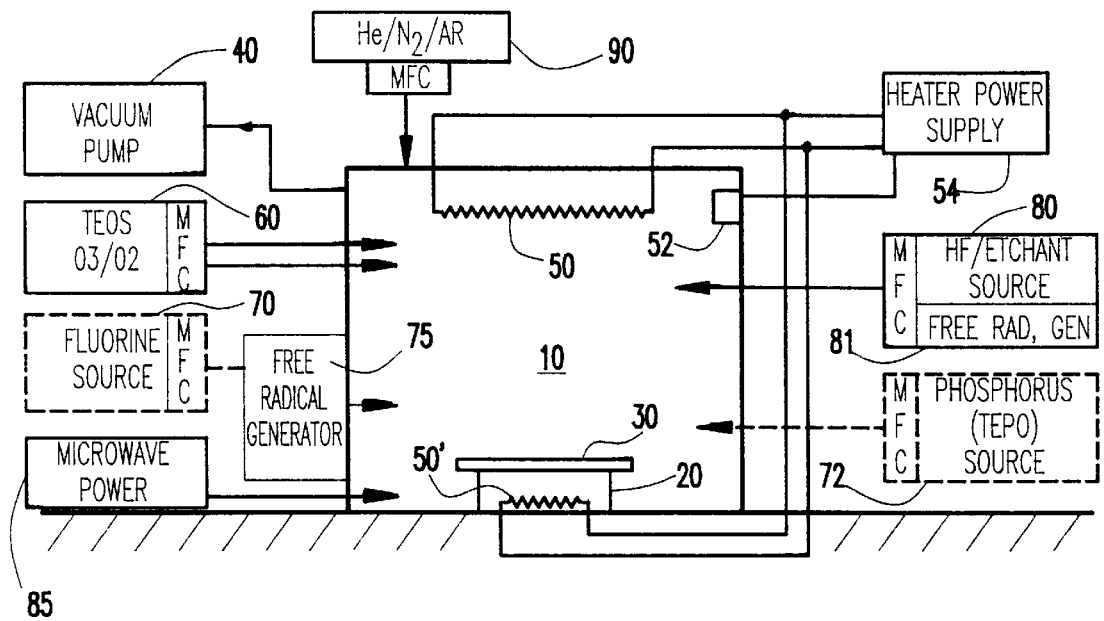
FIG. 1 is a schematic diagram of a chemical vapor deposition reactor chamber preferred for practice of the present invention.

Referring now to the drawings, and more particularly to FIG. 1, there is shown a schematic depiction of a reactor chamber 10 suitable for carrying out the invention. The details of the reactor chamber 10 are not critical to the practice of the invention and known reactor chambers could be used (with additional elements) to practice the invention. Further, details of the reactant or etchant supplies which are schematically depicted in FIG. 1 will be individually familiar to those skilled in the art. Additionally the use of TEOS and ozone, included in FIG. 1, is known for sub-atmospheric chemical vapor deposition. However, it is to be understood that no other portion of FIG. 1 is admitted to be prior art in regard to the present invention. It should also be understood that FIG. 1 includes a depiction of structure which may be employed in the practice of variations of the invention in accordance with the principles thereof but that the preferred form of the invention and numerous variations thereof can be practiced with less than the entirety of the structure depicted, as will become evident to those skilled in the art from the following discussion.

The reaction chamber 10 includes a chuck 20, preferably of the electrostatic type, to immobilize the wafer 30 during processing and should preferably be designed to support the wafer at a temperature at which processing is to be done but is otherwise not critical to the practice of the invention. The reaction chamber is also provided with a vacuum pump 40 to achieve a desired sub-atmospheric pressure (unless atmospheric pressure or higher pressure is desired for the process, in which case it is sufficient to regulate pressure by flow of exhaust from the chamber relative to input mass, principally from a helium, nitrogen or argon source 90) and a heating arrangement including a heat source 50 and/or 50', a thermostat 52 for sensing temperature in the reactor vessel 10 and a power supply 54 controlled by thermostat 52 to accurately maintain a desired temperature. Placement of the heat source within the chuck 20, as shown at 50' is preferred for even heating of the wafer. However, it should also be noted that heating of the reactor vessel interior, as depicted at 50, is helpful in avoiding condensation of reactants thereon.

To supply reactant precursor materials into the reactor vessel 10 in accordance with the invention, silicate precursor material source 60 preferably provides a mixture of TEOS, ozone, and oxygen or other alkoxysilane or organosilicon source such as diacetoxyditertiarybutoxysilane (DADBS), hexamethyldisiloxane, hexamethyl cyclotrisiloxane, octamethylcyclotetrasiloxane and tetrafluoroethylsilicate through respective mass flow controllers (MFC). A phosphorus and/ or boron source 72 may be included to add dopant (as, for example, TEPO for phosphorus and triethylborate for boron) to the glass to reduce viscosity and reflow temperature as may be desired, although, as will be discussed below, the present invention does not rely to any significant degree on viscosity and reflow temperature and is intended to avoid annealing/reflow operations. Nevertheless, some additional benefits in trench filling may be realized by inclusion of boron and phosphorus as dopants.

Further, as alluded to above, a fluorine dopant is generally considered to be desirable for reduction of the dielectric constant of the film. Fluorine source 70 is thus provided to supply fluorine in the form of, for example, silicon fluoride (e.g. $SiF_4$ or $SiH_2F_2$) or a fluorocarbon to reactor vessel 10 through a mass flow controller MFC. Use of a free radical generator (e.g. ionizer or ozonator) 75 is preferred to increase availability of dissociated fluorine when a fluorocarbon or $NF_3$ or the like is used as a source of fluorine but is not necessary for fluorine compounds of silicon such as silicon fluoride or F-TEOS since associated silicon and fluorine can be directly deposited. Again, the invention does not rely on changes in viscosity for film reflow based on inclusion of fluorine as a dopant since the present invention allows reflow/annealing operations to be avoided but inclusion of fluorine is preferred for reduction of dielectric constant and may provide some beneficial effects on gap filling and film density by mechanisms similar to reflow which may occur during deposition at elevated temperatures.

It should be further noted that some etchants suitable for use in the practice of the invention, such as hydrogen fluoride, as will be discussed below, may provide some small "background" component of fluorine concentration in the film. However, there is a well-defined and highly repeatable functional relationship between flow rates of materials used as a fluorine source, as described above, and fluorine concentration in the as-deposited film. Control of delivery of fluorine source materials provides adequate control of fluorine content of the as-deposited film for practice of the invention and realization of the meritorious effects thereof, particularly in regard to reduction of dielectric constant of the film, notwithstanding delivery of fluorine in an etchant.

In accordance with the invention, however, a hydrogen fluoride (HF)/etchant source 80 is provided in addition to source of reactants which deliver the material to be deposited. Hydrogen fluoride is a preferred etchant since the etch rate obtainable under a variety of conditions is well-known and highly repeatable. Other well-understood etchants suitable for practice of the invention are nitrogen fluoride ($NF_3$) and CxFy, (e.g. $C_4F_8$, $C_2F_6$ and the like). These etchants may also be used in combination with each other to adjust the etch rate.

At the preferred temperature of 500°–650° C. and at any desired pressure between 50 and 700 Torr, a 500–1000 sccm flow of HF provides an etch rate of 1000–3000 Angstroms per minute and can be adjusted by adjustment of its delivery rate into the reactor. At the same temperature and pressure, a flow rate of 500–1000 sccm of $NF_3$ provides an etch rate of somewhat more than 500 Angstroms per minute and can be adjusted to a higher rate by a downstream plasma source since $NF_3$ dissociation is less effective than HF. For a flow rate of 500–2000 sccm of CxFy at the same temperature and pressure, much lower etch rates of about 20–50 Angstroms per minute which can be adjusted by adjustment of temperature to about 200 Angstroms per minute above 600° C. The etch rate using CxFy or other etchant can also be increased by use of a free radical generator 81 and/or microwave excitation which may be included therein or downstream as indicated at 85.

Figures 2, 3, 4:
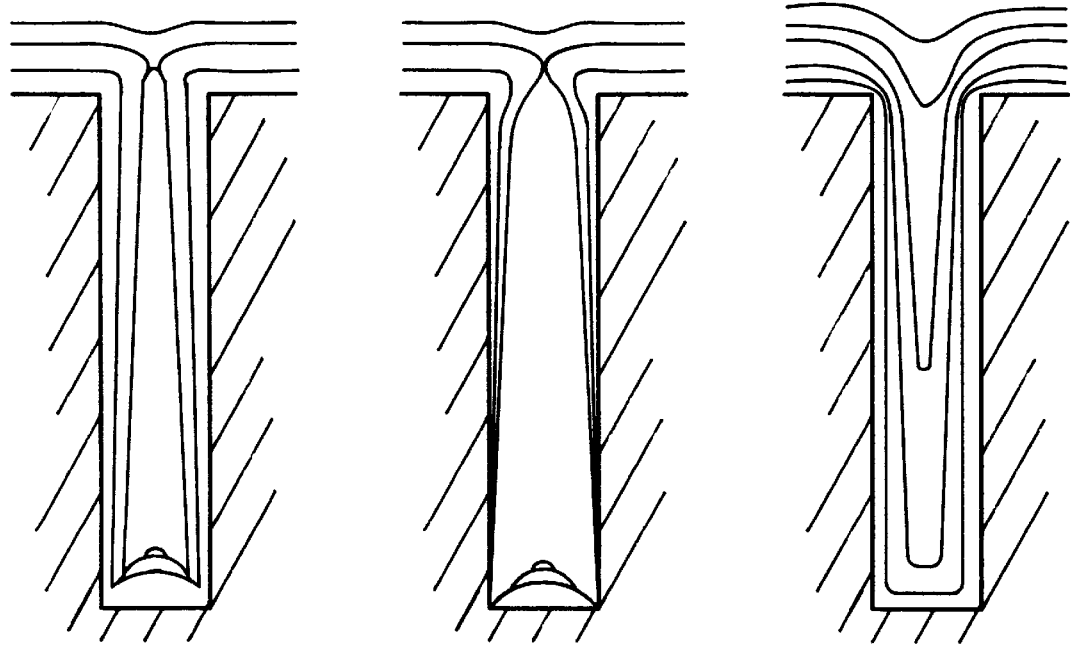
FIGS. 2 and 3 are cross-sectional views of a high aspect ratio trench illustrating void formation during filling by THCVD and PECVD processes having differing degrees of conformality of deposition.
FIG. 4 is a cross-sectional view of a high aspect ratio trench depicting deposition using simultaneous THCVD and etching in accordance with the invention.

As discussed above, $TEOS/O_2$ PECVD and $TEOS/O_3$ THCVD, both of which are known to proceed with relatively high conformality, also provide well-understood and repeatable deposition rates in accordance with temperature, pressure and reactant precursor mass flow rate but with very different corner coverage characteristics. For example, as shown in FIG. 2 filling of high aspect ratio trenches by $TEOS/O_3$ THCVD begins relatively conformally but conformality decreases markedly as the relatively conformal deposition increases the aspect ratio and a degree of non-conformality tends to close the top of the trench and leave a keyhole-shaped void. For comparison, as shown in FIG. 3, $TEOS/O_2$ PECVD is somewhat less conformal and tends to close the top of the trench even more rapidly, leaving a larger void. Much less material is deposited in the trench and reflow is generally less effective to fill the void.

In accordance with the invention, etching and deposition are caused to occur concurrently in the same THCVD process. Additionally, the process is preferably carried out at a relatively high temperature of 500°–650° C. but which is below the maximum allowable temperature for advanced CMOS designs and within the heat budget of many other critical current designs. This relatively high temperature assures that deposition occurs only at the most stable available surface sites and the film is adequately dense as deposited to avoid any need for later densification by annealing at a higher temperature. Further, as a result of improved surface mobility of reactive intermediates at the higher temperature, the interior of gaps and trenches is coated more conformally.

Etching is somewhat more effective at corners of surface topography since etching is occurring from different sides of the same mass. Any onset of closure of the trench is etched even more effectively for the same reason. Furthermore, as the flux of etchant reaching the top surface of the gap is three to four times greater than the etchant flux reaching the bottom of a 0.1 to 0.3 micron opening, the reduction in deposition rate due to etching at the bottom surface of the opening is relatively small. Therefore, concurrent etching and deposition using THCVD tends to keep the tops of trenches open and to reverse the (potentially severe) non-conformality generally associated with THCVD processes as shown in FIG. 4. Note that even though the trench is narrowed and the aspect ratio of the trench initially increases somewhat as the trench is filled, the thickness of the film tapers oppositely to that of FIGS. 2 and 3 within the trench.

While etching occurs concurrently with deposition at high temperature, resulting in a reduced deposition rate at the top of the trenches or gaps, overall throughput may be increased (based upon the net deposition rate), particularly if plural wafers are processed together, and multi-step deposition and etch back processes and reflow/annealing and/or densification processes are avoided. In this regard, a wide range of net deposition rates (e.g. the excess of deposition rate over the etch rate) can be employed. For example, under the preferred deposition conditions, a SACVD PSG process with additional HF etchant can provide net deposition rates from about 350–1100 Angstroms per minute depending on flow rate of film precursor materials. For example, at pressures in the range of 400–700 Torr, HF flow rate of 20–500 sccm (preferably 50–300 sccm), and oxygen input to an ozonator of 200–4000 sccm to deliver 8.5% ozone, delivery of 300–6000 sccm of He/TEOS at an ampule temperature of 48° C. (e.g. the temperature of the liquid material source which is delivered as a vapor in a gas such as helium bubbled through the liquid) or 1800–3000 sccm He/TEPO at an ampule temperature of 46° C. will produce corresponding deposition rates of between about 30–120 nm per minute.

The process is relatively non-critical (e.g. it is only necessary that the deposition rate be in excess of the etching rate (but not so large as to render the etch rate relatively negligible) in order to practice the invention to obtain successful gap filling in accordance with the principles of the invention. However, the preferred net deposition rate for gap fill is strongly dependent on the opening dimension and aspect ratio of the trench or gap to be filled. In general, smaller openings and higher trench aspect ratios indicate that smaller net deposition rates should be employed to provide void free gap fill. A net deposition rate in nm (or other arbitrary units per minute) per minute which is equal to or less than one-half the smallest gap opening in nm (or the same arbitrary units) will provide reliable fill for gap aspect ratios greater than 1:1 and up to about 3:1 to 4:1.

Slower net deposition rates will generally improve gap fill in critical geometries. In this regard, it should be recalled that (as shown in FIG. 4) when the initial aspect ratio of a trench is greater than about 1.5:1, conformal net deposition tends to both narrow the opening and increase the aspect ratio of the remaining trench or gap during intermediate stages of the fill process and it may be advantageous in maximizing throughput to gradually decrease and then increase net deposition rate in accordance with estimated or empirically determined instantaneous aspect ratio of the gap or trench as the fill process progresses.

In view of the foregoing, it is seen that the invention provides for gap filling with a dense silicate glass film which avoids the need for densification and/or reflow processes, is compatible with current DRAM and CMOS technologies and can be accomplished within a reduced maximum temperature and heat budget to fill gaps and trenches of a size and aspect ratio which could not be filled by known processes. Boron and phosphorus dopants can be used or omitted, as desired, although some improvement in filling of very narrow or high aspect ratio features can be expected when such dopants are included. Fluorine dopants can be added at will at the preferred temperatures to control dielectric constant of the film.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method of forming a silicate glass film comprising the steps of
   heating a deposition surface to a temperature in the range of 500°–650° C., and
   concurrently depositing and etching a silicate glass including regulation of flow of reactant precursor materials and etchant materials such that deposition rate exceeds an etching rate.

2. A method as recited in claim 1, including the further step of
   providing a source of fluorine dopant.

3. A method as recited in claim 2, including the further step of
   providing a source of phosphorus dopant.

4. A method as recited in claim 3, including the further step of
   providing a source of boron dopant.

5. A method as recited in claim 2, including the further step of
   providing a source of boron dopant.

6. A method as recited in claim 1, including the further step of
   providing a source of phosphorus dopant.

7. A method as recited in claim 6, including the further step of
   providing a source of boron dopant.

8. A method as recited in claim 1, including the further step of
   providing a source of boron dopant.

9. A method as recited in claim 1, wherein said step of concurrently depositing and etching is performed at a pressure in the range of 50–700 Torr.

10. A method as recited in claim 1, wherein said deposition rate exceeds said etching rate in arbitrary units per minute by an amount equal to or less than one-half of an opening dimension in said arbitrary units.

11. A method as recited in claim 1, wherein said reactant precursor materials include tetraethylorthosilicate.

12. A method as recited in claim 1, wherein said etchant materials include hydrogen fluoride.

* * * * *

UNITED STATES PATENT AND TRADEMARK OFFICE
CERTIFICATE OF CORRECTION

| | |
|---|---|
| PATENT NO. | : 6,077,786 |
| DATED | : June 20, 2000 |
| INVENTOR(S) | : Chakravarti et al. |

It is certified that error appears in the above-identified patent and that said Letters Patent is hereby corrected as shown below:

At column 9, line 35, after "...a temperature in" delete "the" and insert --a--.

At column 10, line 27, after "sure in" delete "the" and insert --a--.

Signed and Sealed this

Fifth Day of June, 2001

*Attest:*

*Attesting Officer*

NICHOLAS P. GODICI

*Acting Director of the United States Patent and Trademark Office*